(12) United States Patent
Nishimura et al.

(10) Patent No.: US 6,615,669 B1
(45) Date of Patent: Sep. 9, 2003

(54) PRESSURE SENSOR DEVICE

(75) Inventors: Etsuo Nishimura, Tokyo (JP); Hiroshi Nakamura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/440,688

(22) Filed: Nov. 16, 1999

(30) Foreign Application Priority Data

May 28, 1999 (JP) .......................................... 11-150761

(51) Int. Cl.[7] ................................................ G01L 7/00
(52) U.S. Cl. ........................................... 73/756; 73/706
(58) Field of Search ........................ 73/708, 706, 720, 73/727, 754, 756

(56) References Cited

U.S. PATENT DOCUMENTS

| 5,257,547 | A | | 11/1993 | Boyer | |
|---|---|---|---|---|---|
| 5,948,989 | A | * | 9/1999 | Ichikawa et al. | 73/708 |
| 5,948,991 | A | * | 9/1999 | Nomura et al. | 73/727 |
| 6,050,146 | A | * | 4/2000 | Nakamura et al. | 73/725 |

FOREIGN PATENT DOCUMENTS

| JP | 01098936 A | | 4/1989 | |
|---|---|---|---|---|
| JP | 408103435 | * | 4/1996 | |
| JP | 408233670 A | * | 9/1996 | G01L/9/12 |

* cited by examiner

*Primary Examiner*—Edward Lefkowitz
*Assistant Examiner*—Jermaine Jenkins
(74) *Attorney, Agent, or Firm*—Sughrue Mion, PLLC

(57) ABSTRACT

A pressure sensor device having high reliability and excellent workability, which can be used for both types of sensor elements which receive pressure on the front side and the rear side, can be reduced in size, whose characteristic properties can be confirmed before a sensor module is set in the case, and which eliminates the need for changing the internal structure of the case when the external shape of the case or the shape of a connector is altered. A wall portion projecting to surround a sensor element is formed on the surface of a sensor module, a groove potion is formed in an upper case or a lower case at a position corresponding to the wall portion, and an end of the wall portion is mated with this groove portion through an adhesive to form a closed space for storing the sensor element.

15 Claims, 18 Drawing Sheets

PRESSURE SENSOR DEVICE

BACKGROUND OF THE INVENTION

1. Field of the Invention

The present invention relates to a pressure sensor device and, particularly, to the attachment structure of a sensor module having a sensor element to a case.

2. Description of the Prior Art

FIG. 18 is a sectional view of a pressure sensor device of the prior art disclosed by Japanese Laid-open Patent Application No. 9-43076.

In FIG. 18, a pressure sensitive element 2 is placed in a resin case 1 and a pressure medium is introduced to the rear side of the heat sensitive element 2 from the measurement pressure introduction pipe 3 of the case 1. The case is integrated with a connector unit and molded by inserting a terminal 4 therein. The terminal 4 and the pressure sensitive element 2 are electrically connected to each other by a wire 5.

SUMMARY OF THE INVENTION

Since the semiconductor pressure sensor device of the prior art is constituted as described above and the pressure sensitive element 2 is fixed in the case which is an exterior constituent part, it is difficult to measure pressure and the characteristic properties of this pressure sensor device cannot be adjusted before the pressure sensitive element 2 is placed in the case and wired. Since the pressure element 2 is set in a recess portion of the case 2 and connected to the terminal 4 by the wire 5, only the rear side of the pressure sensitive element 2 receives pressure, thereby making it impossible to use the case for a pressure sensitive element which receives pressure on the front side.

It is an object of the present invention which has been made to solve the above problem to obtain a pressure sensor device having high reliability and excellent workability, which can be used for both types of sensor elements which receive pressure on the front side and the rear side, can be reduced in size, whose characteristic properties can be checked before a sensor module is set in the case, and which eliminates the need for changing the internal structure of the case when the outer shape of the case or the shape of a connector is altered.

According to a first aspect of the present invention, there is provided a pressure sensor device in which a wall portion projecting to surround a sensor element is formed on the surface of a sensor module, a groove potion is formed in an upper case or a lower case at a position corresponding to the wall portion, and an end of the wall portion is mated with this groove portion through an adhesive to form a closed space for storing the sensor element.

According to a second aspect of the present invention, there is provided a pressure sensor device in which the wall portion is formed on the surface of one side opposed to either one of the lower case and the upper case of the sensor module.

According to a third aspect of the present invention, there is provided a pressure sensor device in which the wall portion is formed on the top and under surfaces opposed to the lower case and the upper case of the sensor module and a groove potion is formed in both the upper case and the lower case.

According to a fourth aspect of the present invention, there is provided a pressure sensor device in which a wall portion for surrounding other electronic parts such as a signal processing unit is formed on the surface of the sensor module and an end surface of the wall portion is contacted to the surface of the upper case or the lower case to form a closed space for storing the electronic parts.

According to a fifth aspect of the present invention, there is provided a pressure sensor device in which the length of the wall portion surrounding the electronic parts is lengthened, a groove portion is formed in the upper case or the lower case at a position corresponding to this wall potion, and the wall portion is mated with the groove portion through an adhesive.

According to a sixth aspect of the present invention, there is provided a pressure sensor device in which a closed space for storing the electronic parts and a closed space for storing the sensor element are located on opposite sides of the sensor module.

According to a seventh aspect of the present invention, there is provided a pressure sensor device in which a closed space for storing the electronic parts and a closed space for storing the sensor element are located on opposite sides of the sensor module at positions corresponding to each other.

According to an eighth aspect of the present invention, there is provided a pressure sensor device in which the sensor module is made from a synthetic resin and lead frames for leading the signal of the sensor element to the outside are integrated with the sensor module in such a manner that they extend through the wall portion.

According to a ninth aspect of the present invention, there is provided a pressure sensor device in which a through hole for connecting a pressure hole with a closed space for storing the sensor element is formed in the sensor module when the sensor element and a wall portion surrounding this are provided on the upper case side of the sensor module and the pressure hole for introducing a pressure medium is formed in the lower case.

According to a tenth aspect of the present invention, there is provided a pressure sensor device in which the sensor element is placed on the top surface of the sensor module through a pedestal and an introduction passage is formed in the pedestal at a position corresponding to the through hole.

According to an eleventh aspect of the present invention, there is provided a pressure sensor device in which the sensor element is placed on the top surface of the sensor module through a pedestal and the pedestal is shifted to a position not corresponding to the through hole.

According to a twelfth aspect of the present invention, there is provided a pressure sensor device in which a differential pressure through hole is formed in the sensor module at a position not corresponding to the pedestal and connected with a differential pressure introduction hole for introducing a pressure medium from the outside so that a medium pressure from the differential pressure introduction hole and a medium pressure from the pressure hole are received by the top and under surfaces of the sensor element supported by the pedestal.

According to a thirteenth aspect of the present inventor, there is provided a pressure sensor device in which a filter for purification is installed at the outlet or inlet of the differential pressure through hole.

According to a fourteenth aspect of the present invention, there is provided a pressure sensor device in which distal end portions of a plurality of lead frames are separated from other portions to form external connection portions and the lead frames can be selectively connected to the external connection portions.

According to a fifteenth aspect of the present invention, there is provided a pressure sensor device in which a bent portion is formed at an intermediate portion of each of the lead frames.

The above and other objects, features and advantages of the invention will become more apparent from the following description when taken in conjunction with the accompanying drawings.

BRIEF DESCRIPTION OF THE ACCOMPANYING DRAWINGS

DETAILED DESCRIPTION OF THE PREFERRED EMBODIMENTS

Embodiment 1

Figure 1:
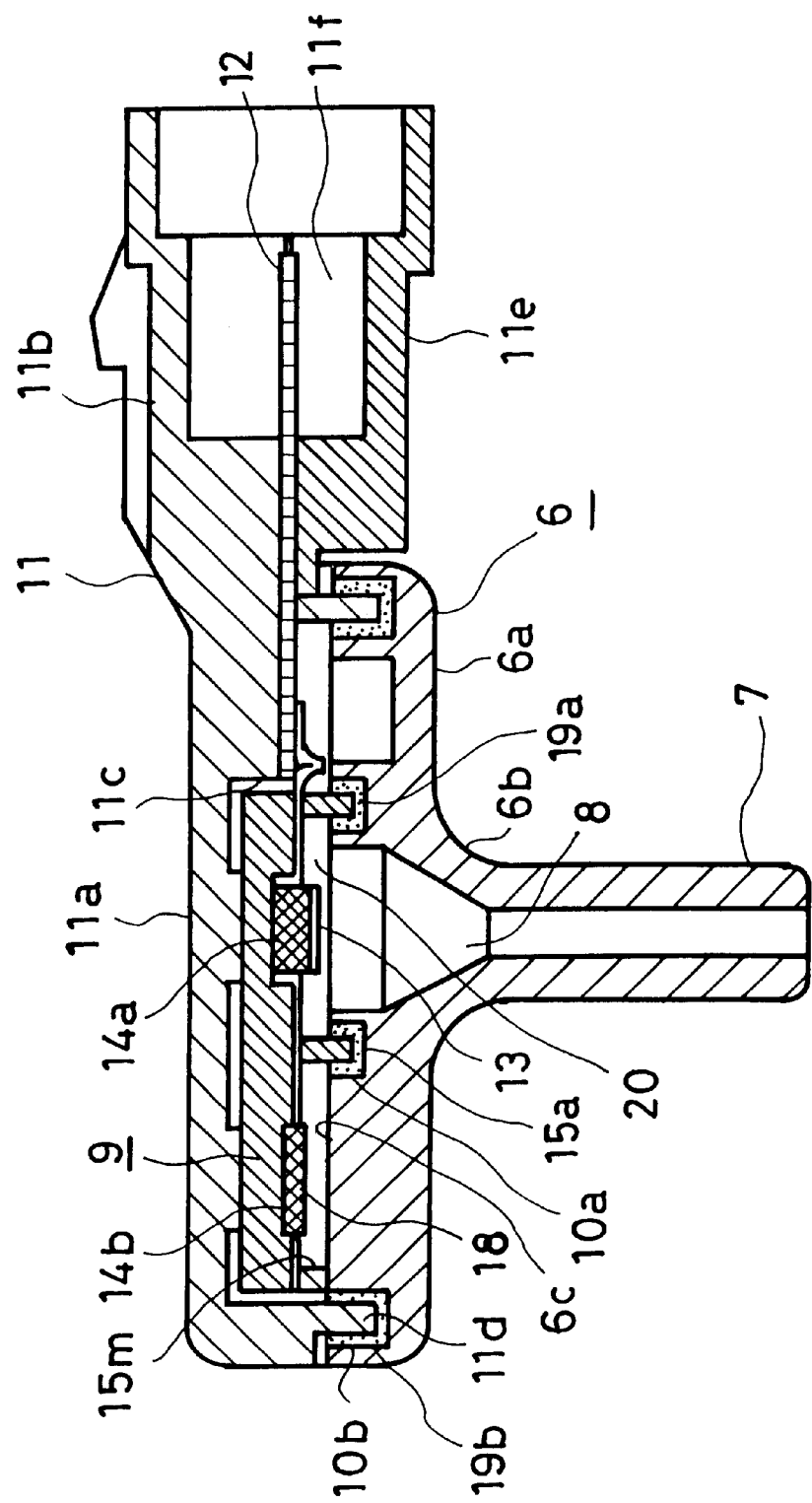
FIG. 1 is a sectional view of a pressure sensor device according to Embodiment 1 of the present invention.

Embodiment 1 of the present invention will be described hereinunder. FIG. 1 is a sectional view of a pressure sensor device according to Embodiment 1 of the present invention. In FIG. 1, reference numeral 6 denotes a lower case having a nipple 7, a pressure medium receiving hole 8 and a groove portion 10a for fixing a sensor module 9 and coating an adhesive for maintaining airtightness.

That is, this lower case 6 has the nipple 7 having the pressure hole 8 for a pressure medium through a funnel portion 6b at the center of a rectangular plate portion 6a having a fixed thickness and projecting downward. A groove portion 10b is formed at the periphery of the top surface of the plate portion 6a and the ring-shaped groove portion 10a having a smaller diameter than that of the groove portion 10b is formed to surround an upper portion of the funnel portion 6b.

Denoted by 11 is an upper case having a terminal 12 inserted thereinto and a connector connection portion 11b. The upper case 11 is shaped like a plate as a whole and comprises a cover portion 11a for covering the lower case 6 and the connector connection portion 11b from which an end of the terminal 12 projects. The cover portion 11a has a recessed portion 11c for storing the sensor module 9 on the under surface and a projecting portion 11d to be mated with the groove portion 10b of the lower case 6 at the periphery of the under surface of the recessed portion 11c. A connector frame 11e is provided below the connector connection portion 11b and this connector frame 11e and the connector connection portion 11b form a recessed portion 11f facing sideways and the end of the terminal 12 extending from the sensor module 9 projects into this recessed portion 11f between the connector connection portion 11b and the connector frame 11e. When an unshown connector is inserted into this recessed portion 11f, the connector can be electrically connected to the terminal 12.

Figure 2:
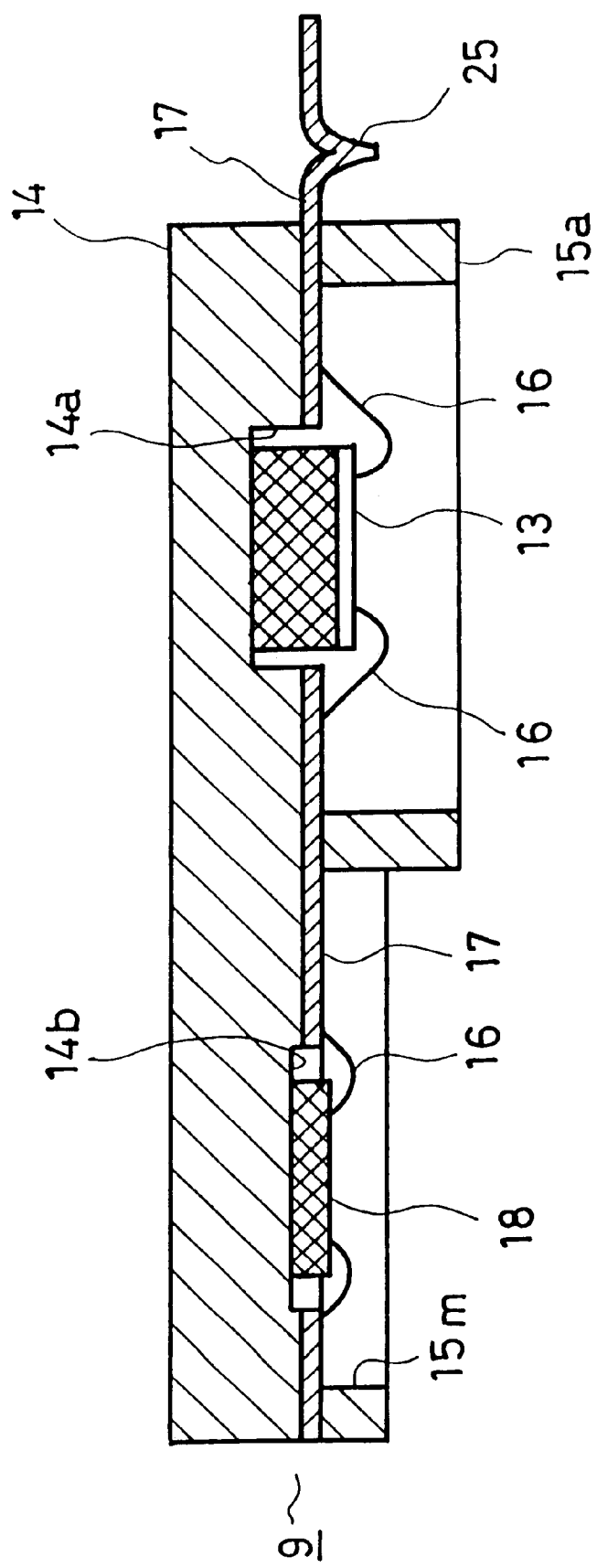
FIG. 2 is a sectional view of a sensor module according to Embodiment 1.
Figure 3:
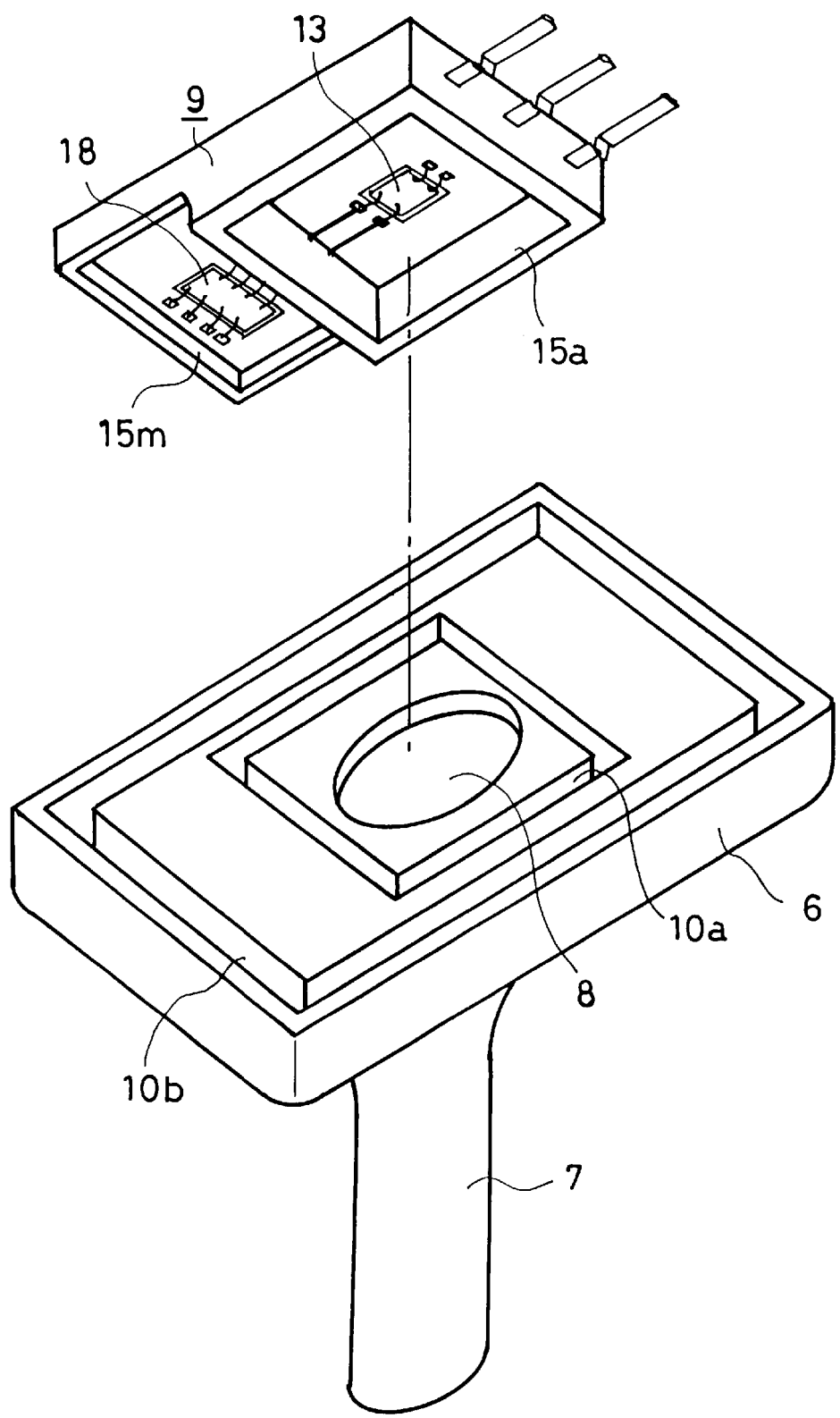
FIG. 3 is an exploded perspective view of a pressure sensor device according to Embodiment 1.

FIG. 2 and FIG. 3 are sectional views of the sensor module 9. A sensor element 13 made of a semiconductor for detecting pressure is placed in a recessed portion 14a formed on the under surface of a module base 14 and connected to lead frames 17 by lead wires 16. A signal processing unit 18 is also placed in a recessed portion 14b formed on the under surface of the module base 14 to amplify an electric signal from the sensor element 13.

A wall portion 15a is formed to surround a portion where the sensor element 13 is arranged and mated with the groove portion 10a of the lower case 6. An adhesive 19a is coated on the inside of the groove portion 10a to ensure the airtightness of a pressure sensitive space portion 20.

Figure 4:
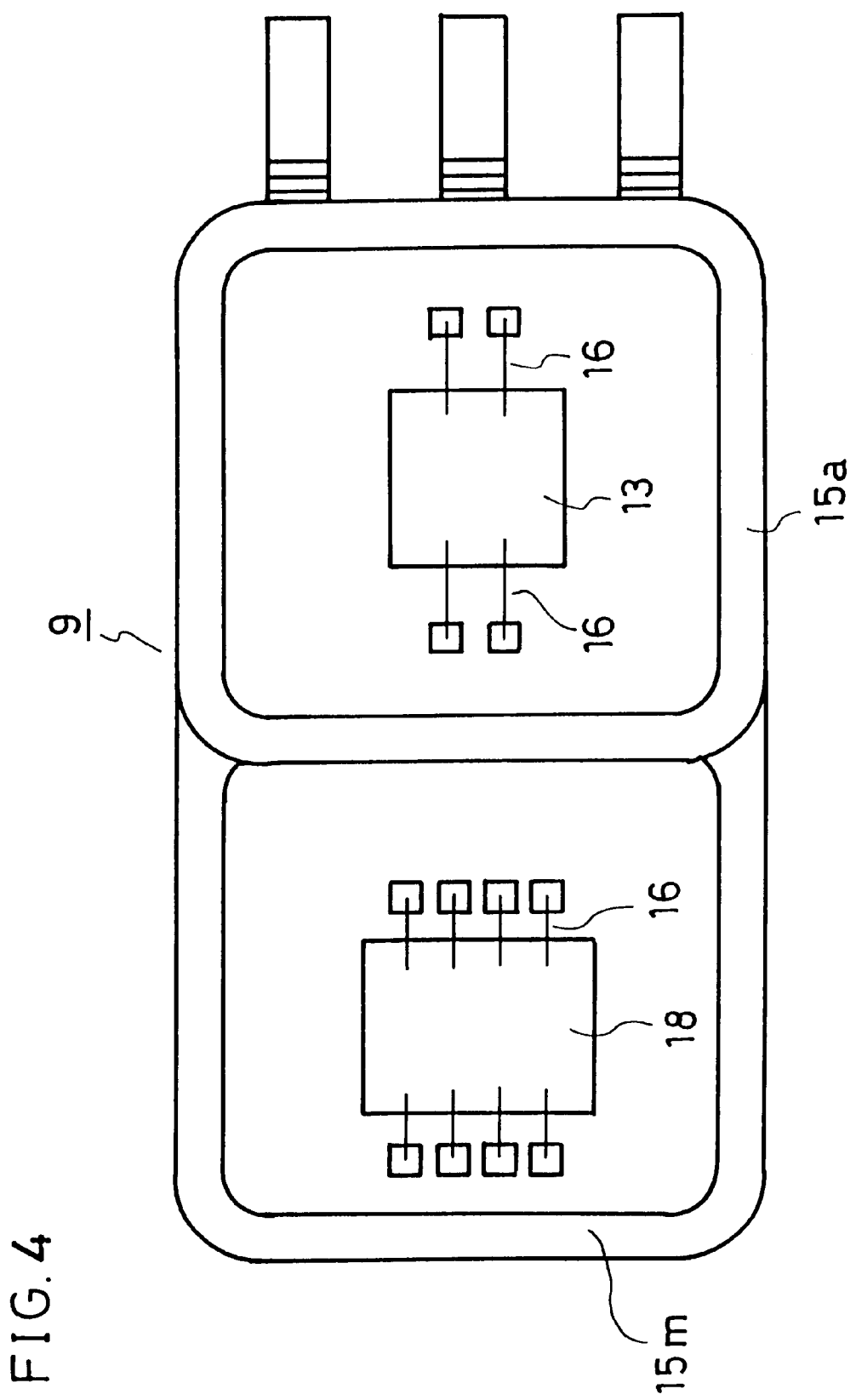
FIG. 4 is a plan view of FIG. 2 according to Embodiment 1.

FIG. 4 is a plan view of the sensor module 9. The sensor element 13 and the signal processing unit 18 are connected to each other by the lead wires 16 through the lead frame. In FIG. 2, the recessed portion 14a is formed at a position corresponding to the pressure medium pressure hole 8, the recessed portion 14b is formed at a position corresponding to the top surface 6c of the plate portion 6a, and the sensor element 13 is stored in the recessed portion 14a to face the pressure medium pressure hole 8. The wall portion 15a projects in such a manner that it surrounds the sensor element 13 and mates with the groove portion 10a. The pressure sensitive space portion 20 is formed by mating the wall portion 15a with the groove portion 10a through the adhesive 19 to be integrated with the groove portion 10a. The lead frames 17 made from a conductive material for connecting the sensor element 13, the signal processing unit 18 and the external terminal 12 are integrated with the under surface of the base 14 of the sensor element 13. In this case, as the base 14 is injection molded out of a synthetic resin to integrate the lead frames 17 therewith, even when the lead frames 17 extend through the wall portion 15a, the airtightness of the pressure sensitive space portion 20 is ensured without fail.

A wall portion 15m lower than the wall portion 15a projects on the recessed portion 14b side of the sensor module 9 and a lower end of the wall portion 15m contacts the top surface 6c to keep airtight a space (closed space for storing the signal processing unit) around the signal processing unit 18.

Since the sensor element 13 and the signal processing unit 18 are all mounted on the base 14 in this embodiment, pressure measurement and the control of characteristic properties are possible with this sensor module 9. As the sensor element 13 and the signal processing unit 18 are separated from each other by the wall portion 15a of the base 14 and a pressure medium is applied to the sensor element 13 alone, the pressure medium does not enter the signal processing unit 18. Therefore, the signal processing unit 18 is not fouled by the pressure medium.

Embodiment 2

Figure 5:
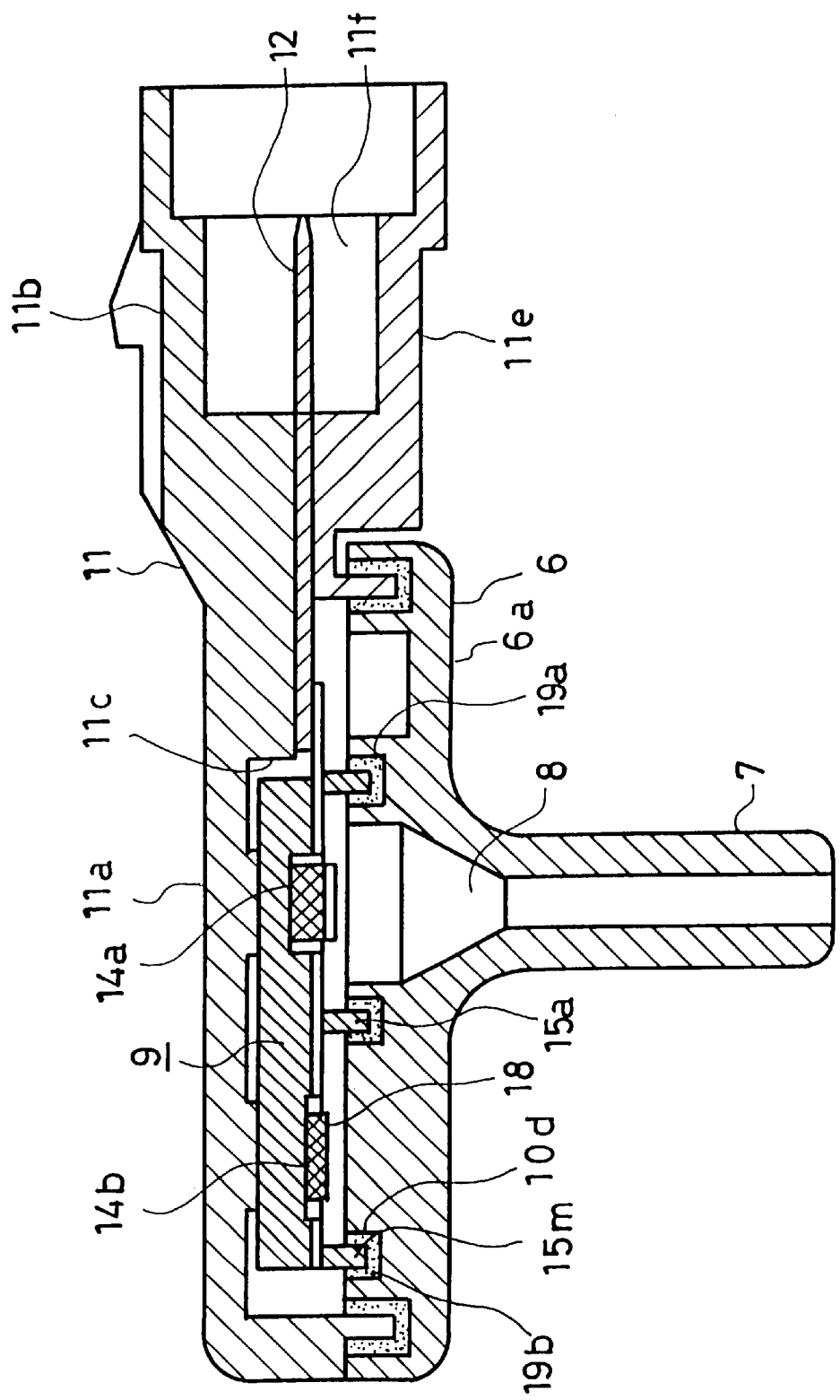
FIG. 5 is a sectional view of a pressure sensor device according to Embodiment 2 of the present invention.

Embodiment 2 of the present invention will be described next. FIG. 5 is a sectional view of a pressure sensor device according to this Embodiment 2. The same or corresponding elements as those of FIGS. 1 to 4 are given the same reference symbols. This Embodiment 2 differs from Embodiment 1 shown in FIG. 1 in that the wall portion 15m formed in the sensor module 9 has the same height as the wall portion 15a, a groove portion 10d is formed at the periphery of the top surface 6c corresponding to the signal processing unit 18 of the lower case 6, and the wall portion 15m is mated with the groove portion 10d through an adhesive 19b to keep airtight a space for storing the signal processing unit 18.

Figure 6:
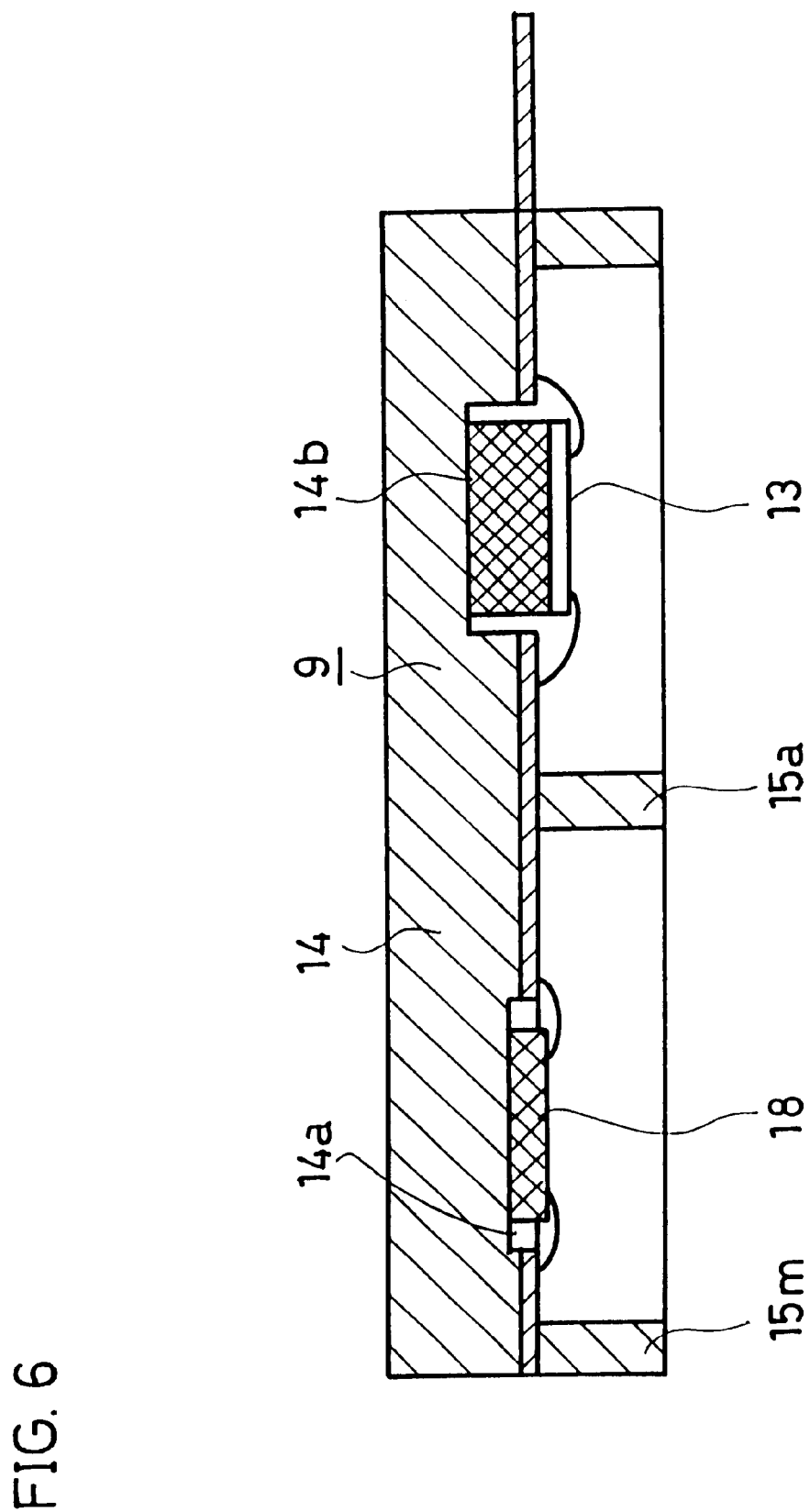
FIG. 6 is a sectional view of a sensor module according to Embodiment 2.

FIG. 6 is a sectional view of the sensor module 9 and shows that the wall portion 15m of the base 14 is formed around the signal processing unit 18.

Figure 7:
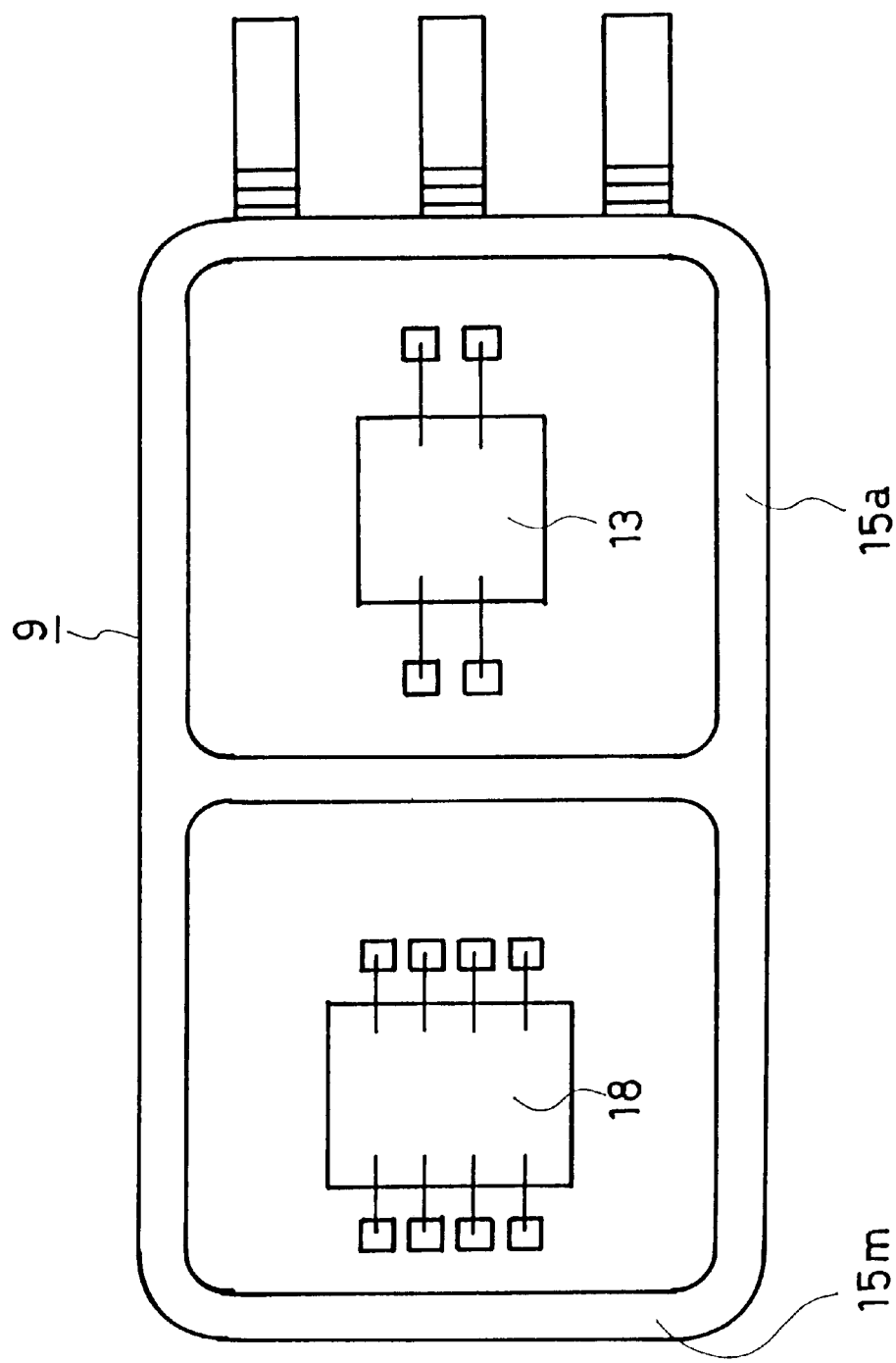
FIG. 7 is a plan view of FIG. 6 according to Embodiment 2.

FIG. 7 is a plan view of the sensor module 9.

Unlike Embodiment 1, the wall portion 15m is made high and mated with the groove portion 10d through the adhesive 12b so that a wall portion is substantially formed all around the sensor module 9, a wall partition is formed between the sensor element 13 and the signal processing unit 18, and the base 14 is bonded to the lower case 6 to increase the bonded area of the sensor module 9, thereby improving fixing reliability. Since the space for storing the signal processing unit 18 is kept airtight to install the signal processing unit 18 in this space, the reliability of the signal processing unit 18 against fouling from the outside is improved.

Embodiment 3

Figure 8:
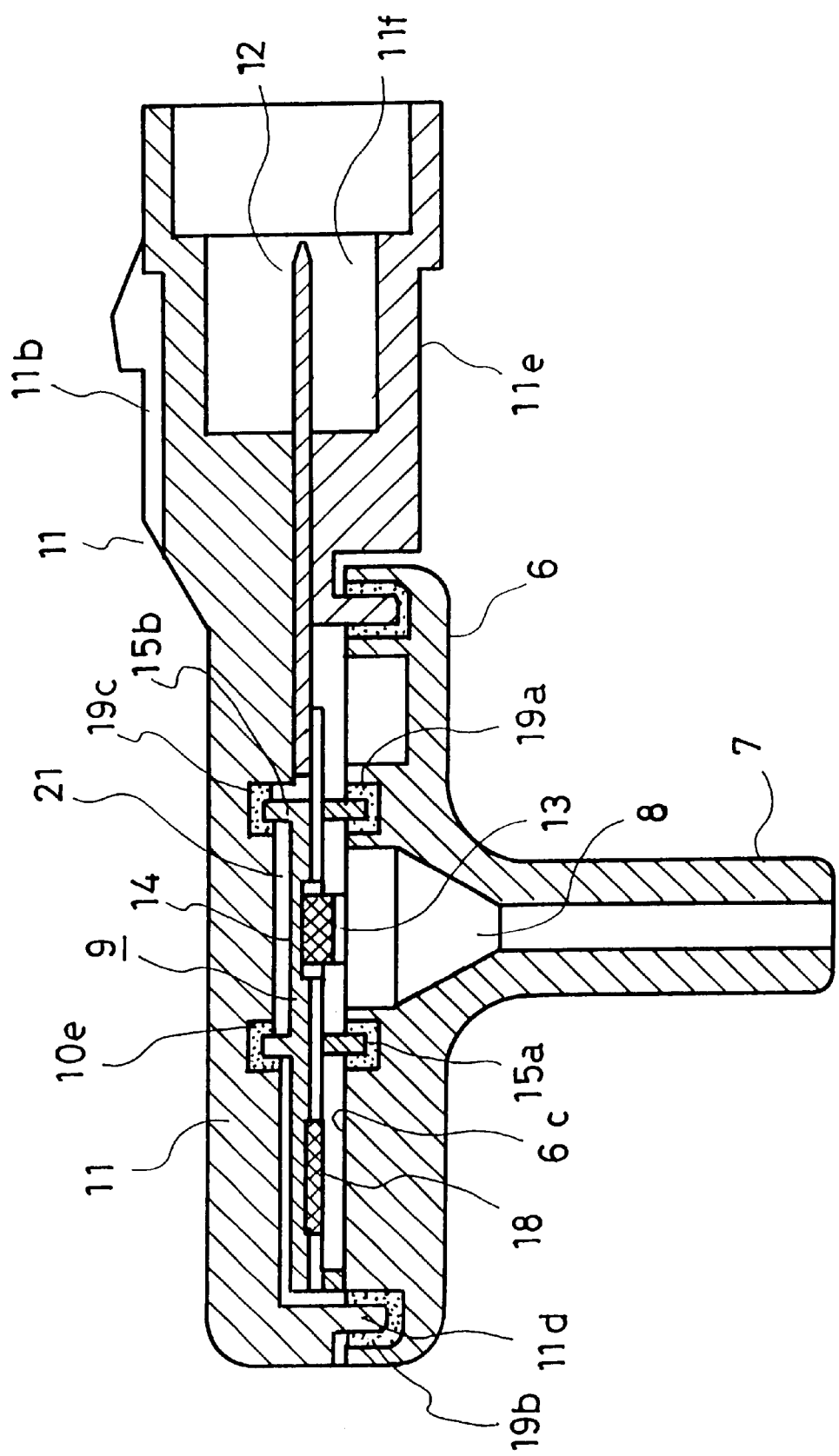
FIG. 8 is a sectional view of a pressure sensor device according to Embodiment 3 of the present invention.
Figure 9:
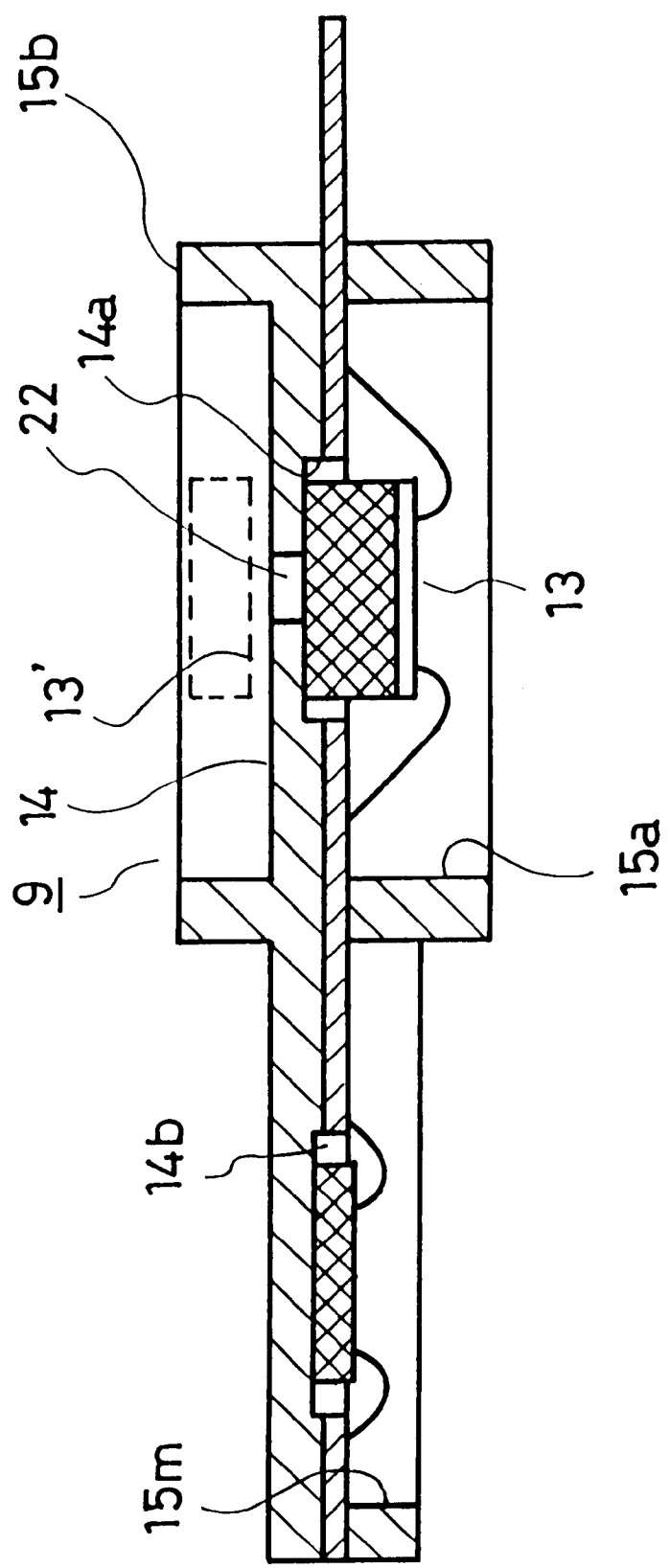
FIG. 9 is a sectional view of a sensor module according to Embodiment 3.

Embodiment 3 of the present invention will be described hereinunder. FIG. 8 is a sectional view of a pressure sensor device according to Embodiment 3 of the present invention. FIG. 9 is a sectional view of the sensor module 9.

A wall portion 15b is also formed on the rear surface (top surface) of the base 14 of the sensor module 9 made of a semiconductor on the sensor element 13 side, and a groove portion 10e is formed on the under surface of the upper case 11. An adhesive 19c is coated on this groove portion 10e to fix the sensor module 9 on the upper case 11. That is, the wall portion 15b corresponding to the wall portion 15a on the under surface projects upward from the top surface of the base 14 of the sensor module 9 and mated with the groove portion 10e formed at a position corresponding to the wall portion 15b through the adhesive 19c to be integrated with the groove portion 10e.

Since the sensor module 9 is bonded to the upper case 6 and the lower case 11 with the adhesives and integrated with these cases, the sensor module can be fixed firmly.

When the wall portions of the sensor element 13 are made symmetrical longitudinally, as shown in FIG. 9, sensor elements 13 and 13' which receive pressure on the front side and the rear side can be selected and used. For example, in the case of the sensor element 13 which receives pressure on the front side, as shown in FIG. 8 and FIG. 9, the sensor element 13 is placed on the base 14. In the case of the sensor element 13' which receives pressure on the rear side, the sensor element 13' is placed upside down. The sensor element attachment portion of the base 14 has a through hole 22 and a pressure medium reaches the rear surface of the sensor element 13' through this through hole 22. In the case of the sensor element 13 which receives pressure on the front side, the through hole 22 is closed by the pedestal of the sensor element 13. The base 13 of the sensor module 9 can be used for the above both types of sensor elements.

Embodiment 4

Embodiment 4 of the present invention will be described hereinunder.

In FIG. 8 explained in Embodiment 3, the signal processing unit 18 may be stored in the airtight space (closed space) between the base 14 and the upper case 11 surrounded by the wall portion 15b. According to this embodiment, the sensor element 13 and the signal processing unit 18 are arranged at positions corresponding to each other in a vertical direction, thereby making it possible to eliminate an extra space for storing the signal processing unit 18 and reduce the area of the sensor module 9. The airtight space 21 and an airtight space for storing the sensor module do not have to be arranged at positions corresponding to each other.

Embodiment 5

Figure 10:
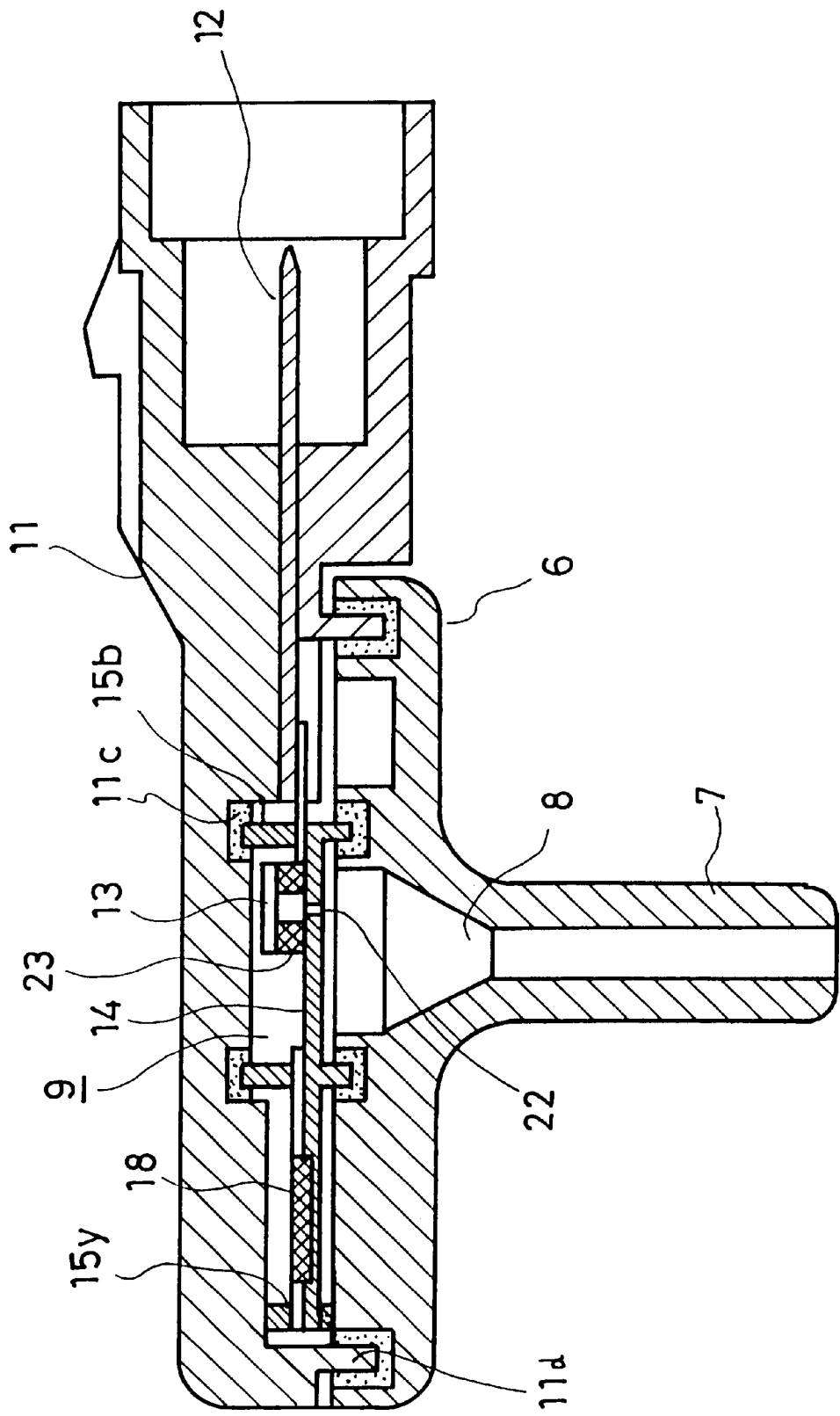
FIG. 10 is a sectional view of a pressure sensor device according to Embodiment 5 of the present invention.
Figure 11:
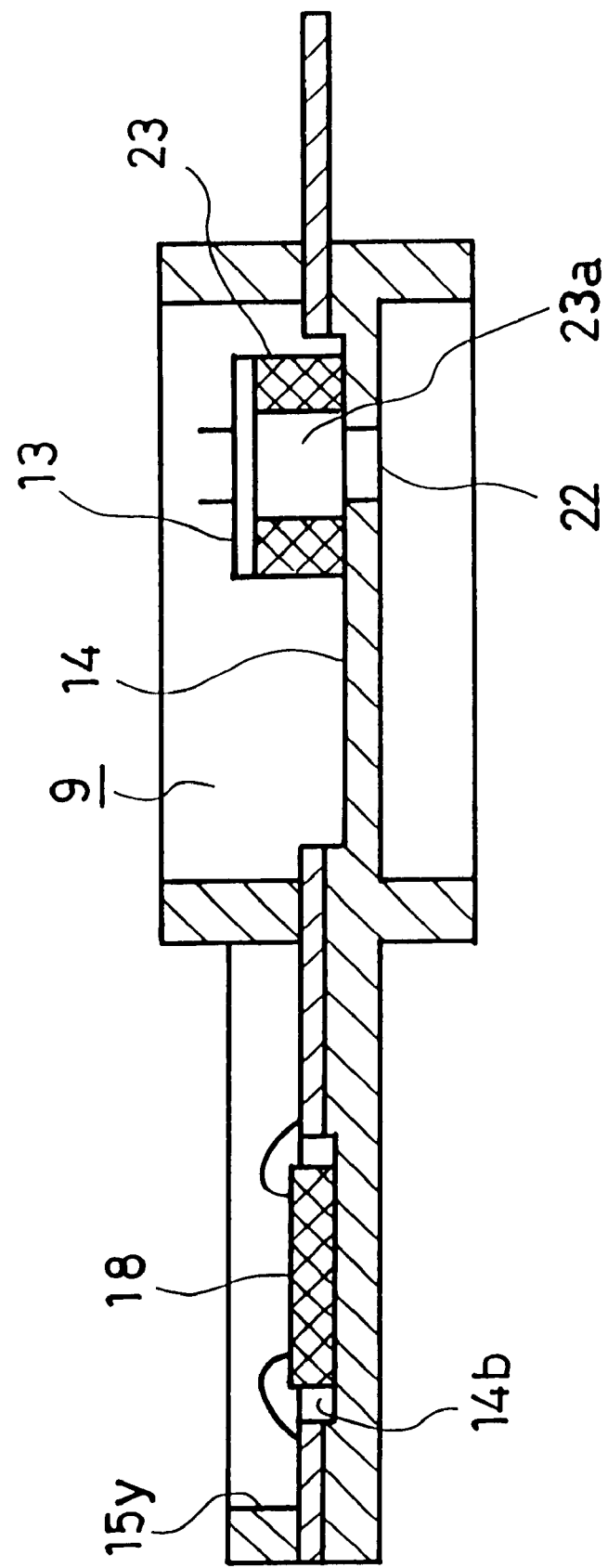
FIG. 11 is a sectional view of a sensor module according to Embodiment 5.

FIG. 10 is a sectional view of a pressure sensor device according to Embodiment 5 of the present invention and FIG. 11 is a sectional view of the sensor module 9 and therearound.

In this Embodiment 5, the sensor element 13 is placed on a ring-shaped sensor pedestal 23 on a side opposite to the pressure hole 8 of the base 14, a through hole 22 is formed in the base 14, the sensor pedestal 23 is installed in such a manner that a pressure introduction passage 23a formed in the sensor pedestal 23 of the sensor element 13 is located above the through hole 22, and the sensor element 13 is disposed on the sensor pedestal 23. The pressure medium is introduced to the rear surface of the sensor element 13 from the pressure hole 8 through the through hole 22 of the base 14 and the introduction passage 23a of the sensor pedestal 23. In this case, a wall portion 15y is formed on an end portion of the base 14 and the signal processing unit 18 is stored and fixed in a recessed portion 14b formed in a portion surrounded by this wall portion 15y of the base 14.

Embodiment 6

Figure 12:
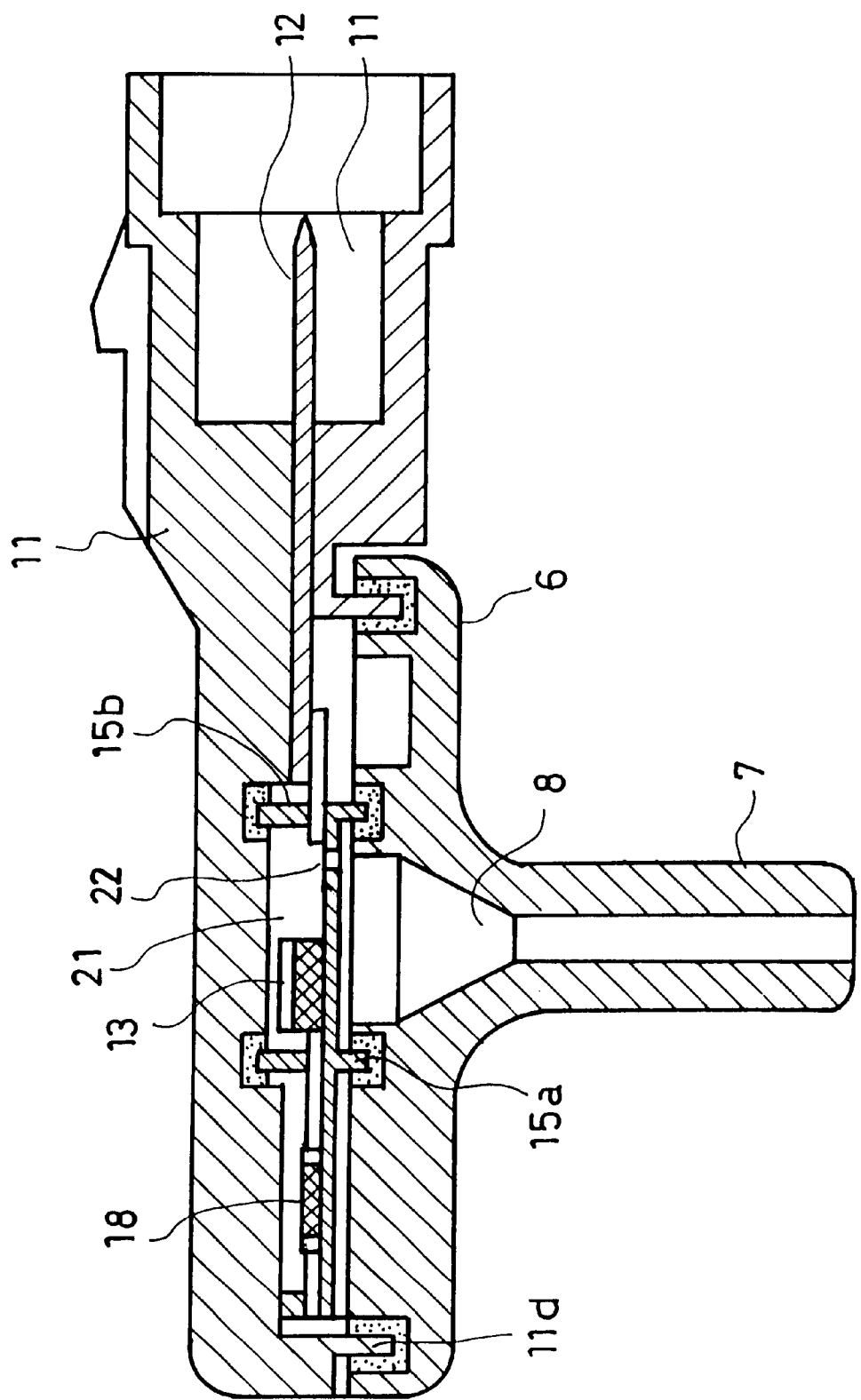
FIG. 12 is a sectional view of a semiconductor pressure sensor according to Embodiment 6 of the present invention.
Figure 13:
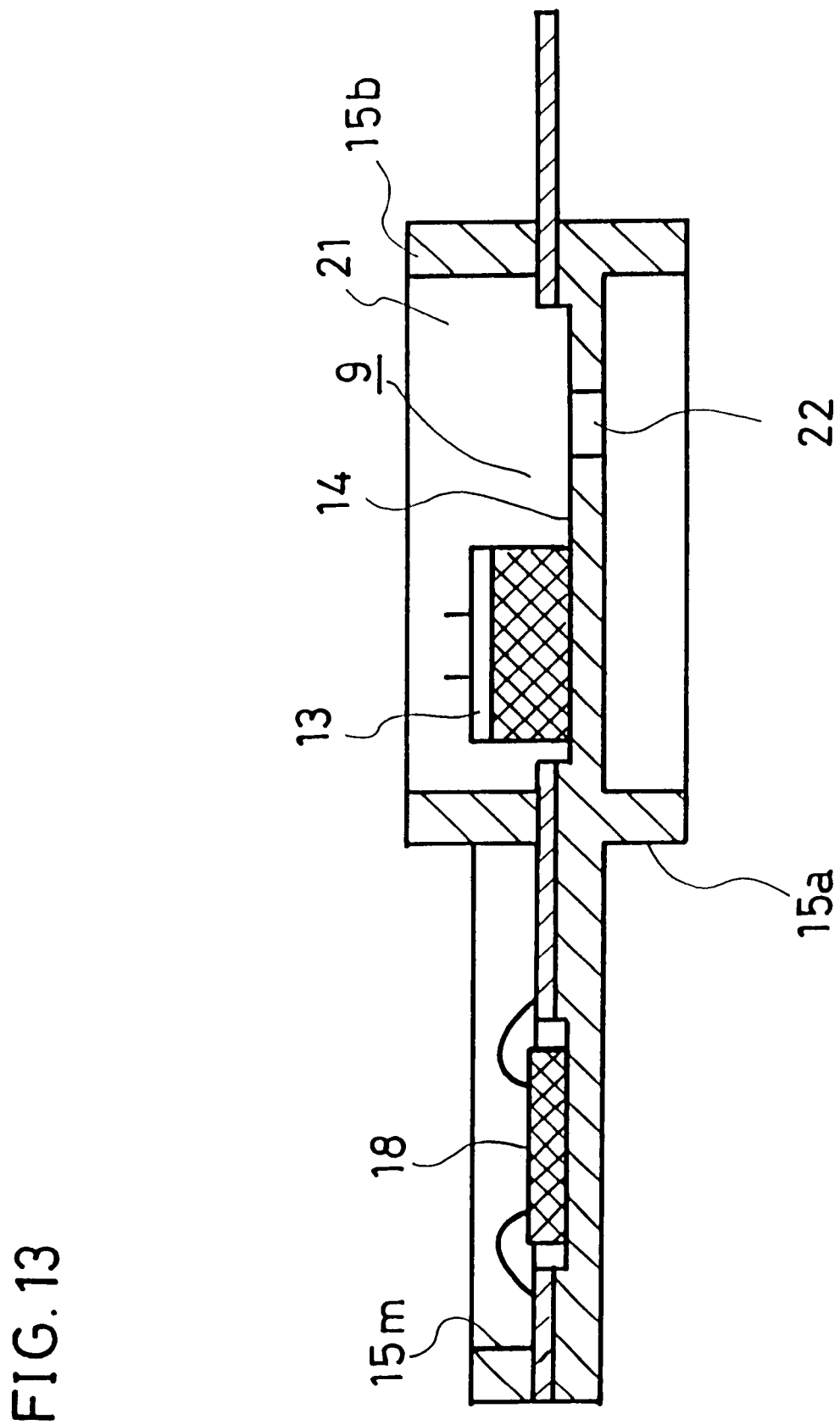
FIG. 13 is a sectional view of a sensor module according to Embodiment 6.

FIG. 12 is a sectional view of a pressure sensor device according to Embodiment 6 of the present invention and FIG. 13 is a sectional view of the sensor module 9. In this embodiment, the sensor module 9 is constituted such that the through hole 22 of the sensor module 9 shown in FIG. 10 of Embodiment 5 is formed in a corner portion of the airtight space 21 surrounded by the wall portion 15b and the sensor element 13 is placed apart from the through hole 22.

The sensor element 13 is installed at an arbitrary position where it does not cover the through hole 22. The pressure medium reaches the front surface of the sensor element 13 from the through hole 22 of the base 14 through the airtight space 21 between the base 14 and the upper case 11.

Both types of sensor elements which receive pressure on the front side and the rear side can be installed on the same base 14. Thus, both a sensor element for receiving pressure on the rear side which is strong against foul and a sensor element for receiving pressure on the front side which is simple in structure and inexpensive can be used according to application purpose.

Embodiment 7

Figure 14:
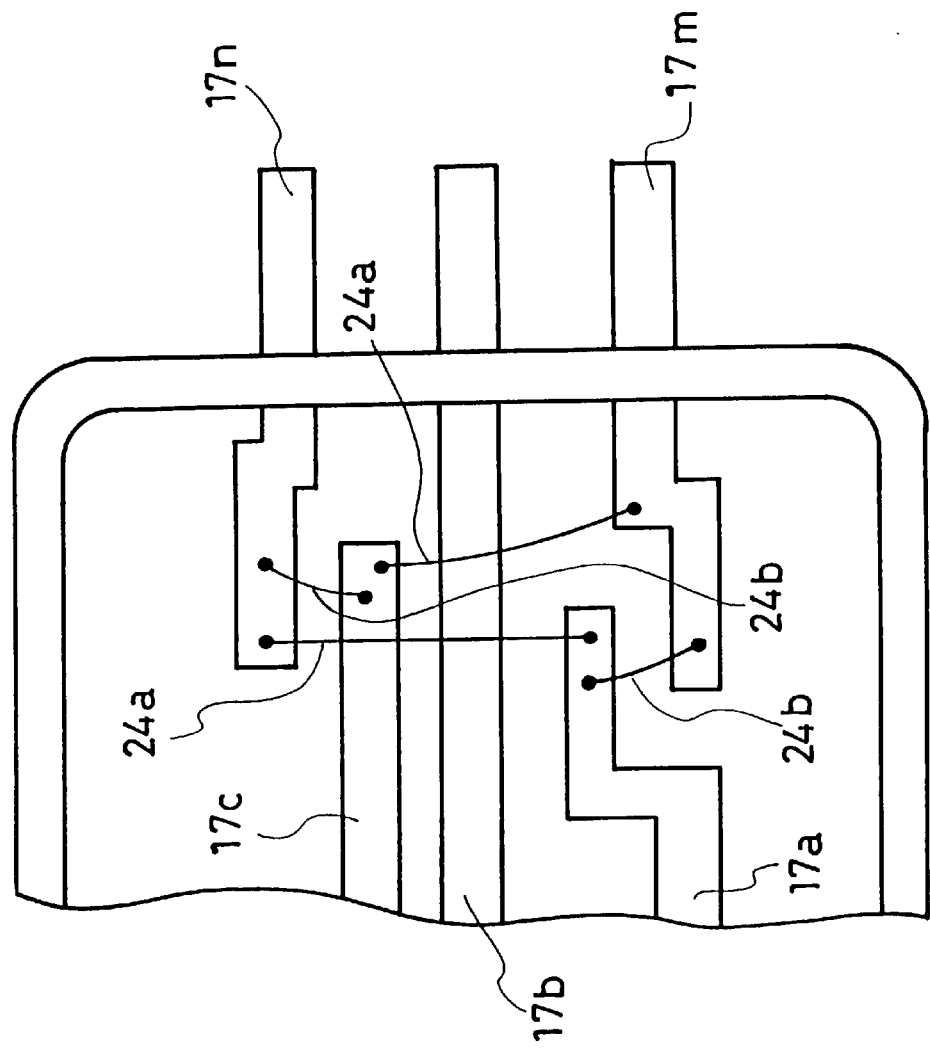
FIG. 14 is a plan view of a sensor module according to Embodiment 7 of the present invention.

FIG. 14 is an enlarged sectional view of a sensor module according to Embodiment 7 of the present invention.

This is almost the same in structure as that of Embodiment 3 shown in FIG. 8. Embodiment 7 differs from Embodiment 3 only in that the signals of the left and right lead frames are inverted when a sensor element 13m is placed on the pressure hole 8 side of the base 14 and when a sensor element 13n is installed on a side opposite to the pressure hole 8 of the base as shown in FIG. 15 before the base 14 is bonded to the lower case 6.

Figure 15:
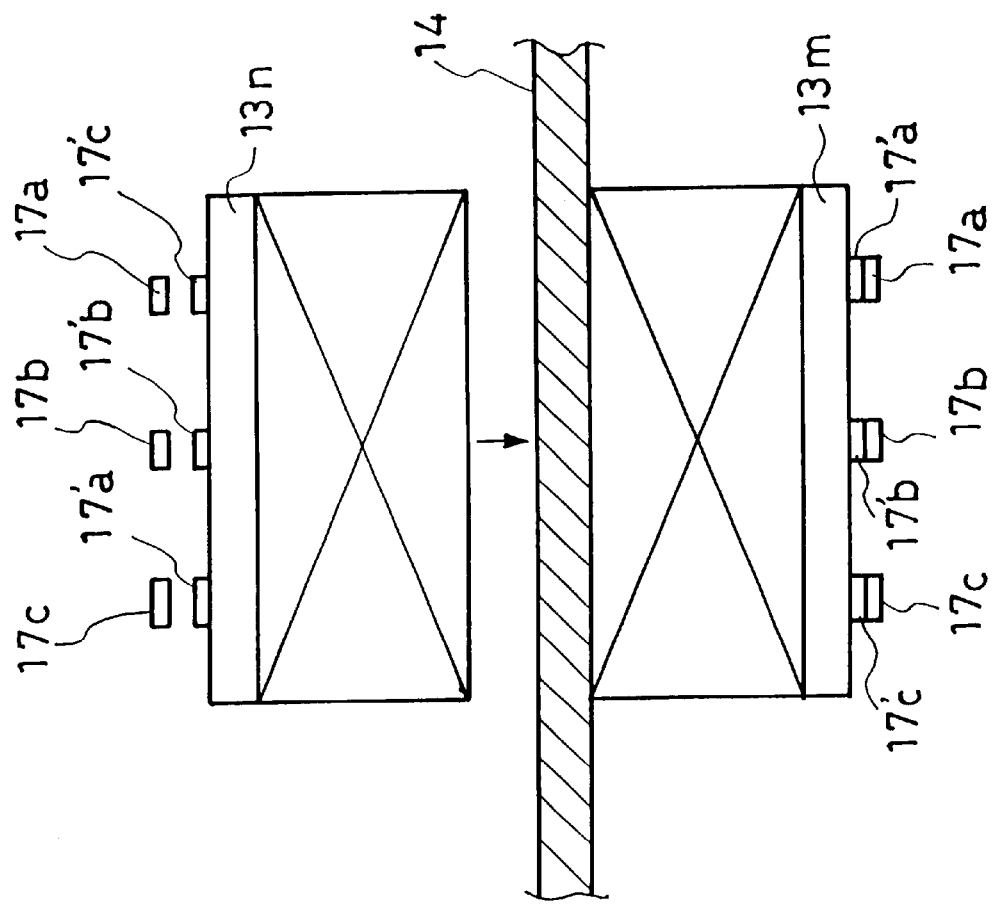
FIG. 15 is a diagram for explaining Embodiment 7.

That is, supposing that pads 17a', 17b' and 17c' are connected to respective lead frames 17a, 17b and 17c when the sensor element 13m facing downward is installed as shown in FIG. 15, to install the sensor element 13n facing upward, the positional relationship between the pads 17a' and 17c' is reversed. Therefore, the lead frames 17a and 17c do not correspond to the pads 17a' and 17c ', whereby labor and time are required to change the connections of external circuits connected by connectors.

Accordingly, in this embodiment, distal end portions of the lead frames 17a and 17c extending outward are separated from other portions to form external connection portions 17m and 17n, respectively, the lead frame 17a is connected to one of the external connection portions 17m and 17n by a bonding wire 24a or a bonding wire 24b, and the lead frame 17c is connected to one of the external connection portions 17m and 17n by the bonding wire 24a or the bonding wire 24b to cope with the case where the above positional relationship is reversed.

In this case, two bonding wires 24a and two bonding wires 24b may be arranged on the pattern shown in FIG. 14, and unrequired bonding wires may be cut according to which one of the sensor elements 13m and 13n is used. According to this embodiment, the signal of the lead frame 17a can be led from either one of the external connection portions 17n and 17m and the signal of the lead frame 17b can be led from either one of the external connection portions 17n and 17m (connection portion different from the above). Therefore, the external connection portions 17n and 17m are selected according to which the sensor element 13m or 13n is used.

Embodiment 8

In this Embodiment 8, as shown in FIG. 1, each of the lead frames 17 has a V-shaped bent portion 25 external to the sensor module 9 at an intermediate position and the bent portion 25 is welded to the terminal 12. According to this Embodiment 8, even if tensile force or shrinkage force is applied to the lead frame 17 from the terminal 12 side due to ambient temperature at the time of use, the tensile fore or shrinkage force can be absorbed by the deformation of the bent portion 25. Therefore, stress generated by the tensile force or shrinkage force is not applied to the interior of the terminal 12 of the lead frame 17, thereby making it possible to prevent the lead frame 17 from separating from the base 14.

Embodiment 9

Figure 16:
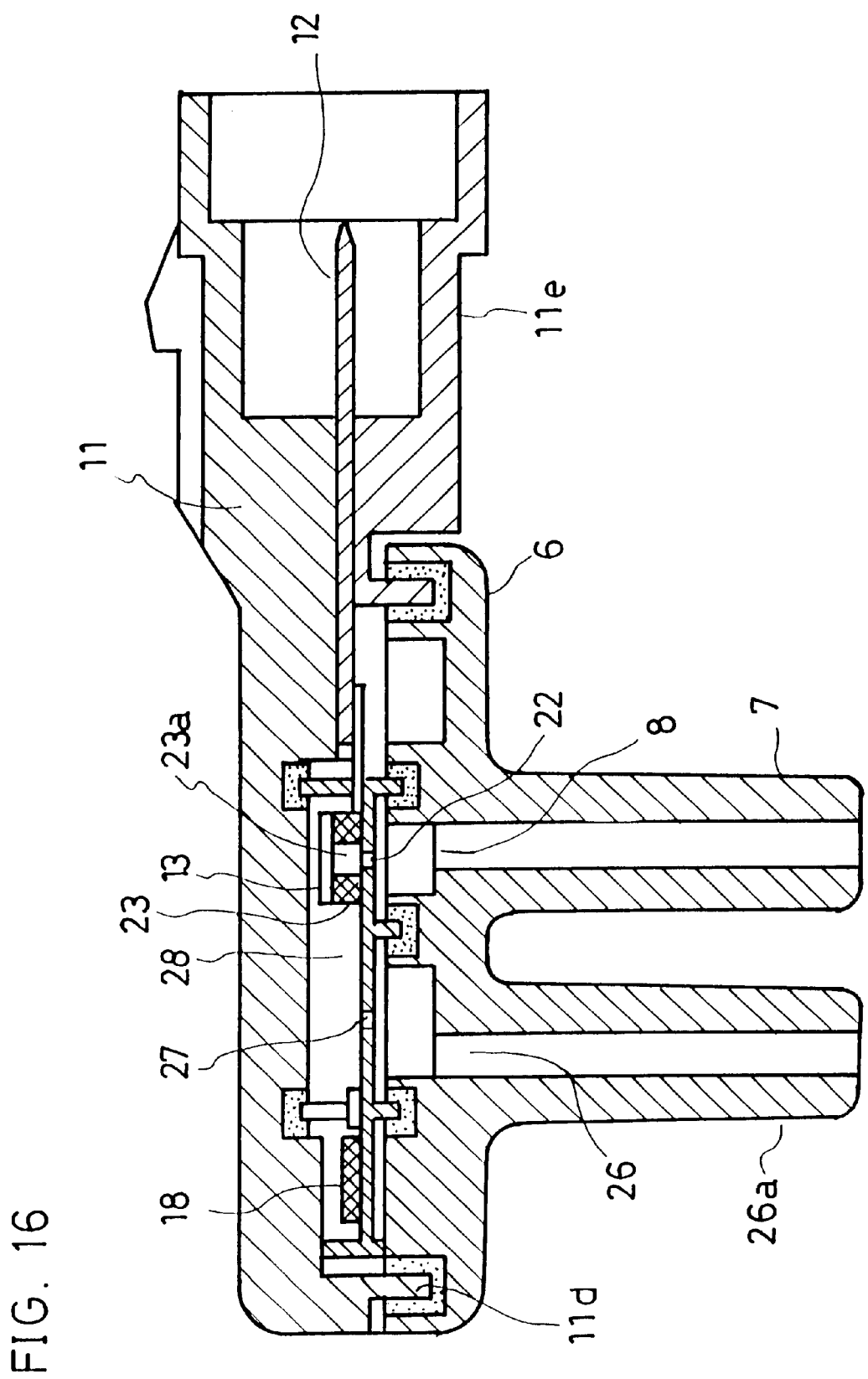
FIG. 16 is a sectional view of a pressure sensor device according to Embodiment 9 of the present invention.

Embodiment 9 of the present invention will be described hereinunder with reference to FIG. 16. FIG. 16 is a sectional view of a pressure sensor device according to Embodiment 9 of the present invention. The same or corresponding elements as those of FIG. 10 are given the same reference symbols. In this case, the sensor element 13 is installed on a side opposite to the pressure hole 8 of the base 14 using the sensor pedestal 23, and a ring-shaped pressure introduction passage 23a is formed in the sensor pedestal 23 and located above the through hole 22 of the base 14. The pressure medium is introduced to the rear surface of the sensor element 13 from the pressure hole 8 of the nipple 7 through the through hole 22 and the pressure introduction passage 23a.

A nipple 26a having a differential pressure introduction hole 26 is connected to the lower case 6, pressure supplied into the differential pressure introduction hole 26 is introduced into a differential pressure sensitive space 28 through the differential pressure through hole 27 of the base 14. The pressure is applied to the front surface of the sensor element 13.

Therefore, pressure from the pressure hole 8 and pressure from the differential pressure introduction hole 26 is supplied to the sensor element 13 from below and from above, respectively, and the sensor element 13 senses a difference between the pressure from above and the pressure from below.

By using the differential pressure through hole 27 and the sensor element 13 which receives pressure on the rear side in the sensor module 9, a simple structured differential sensor can be constructed.

Embodiment 10

Figure 17:
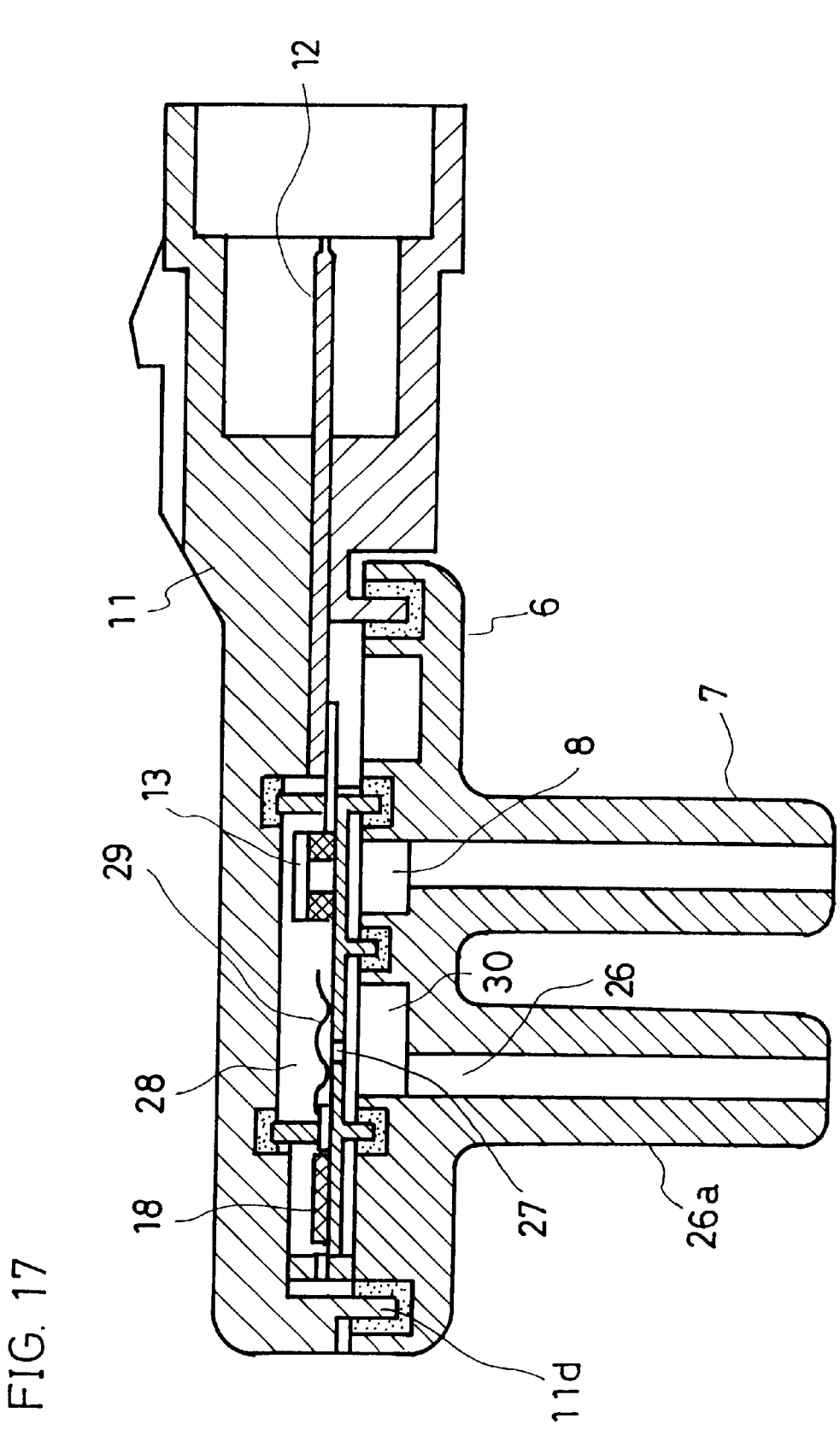
FIG. 17 is a sectional view of a pressure sensor device according to Embodiment 10 of the present invention.
Figure 18:
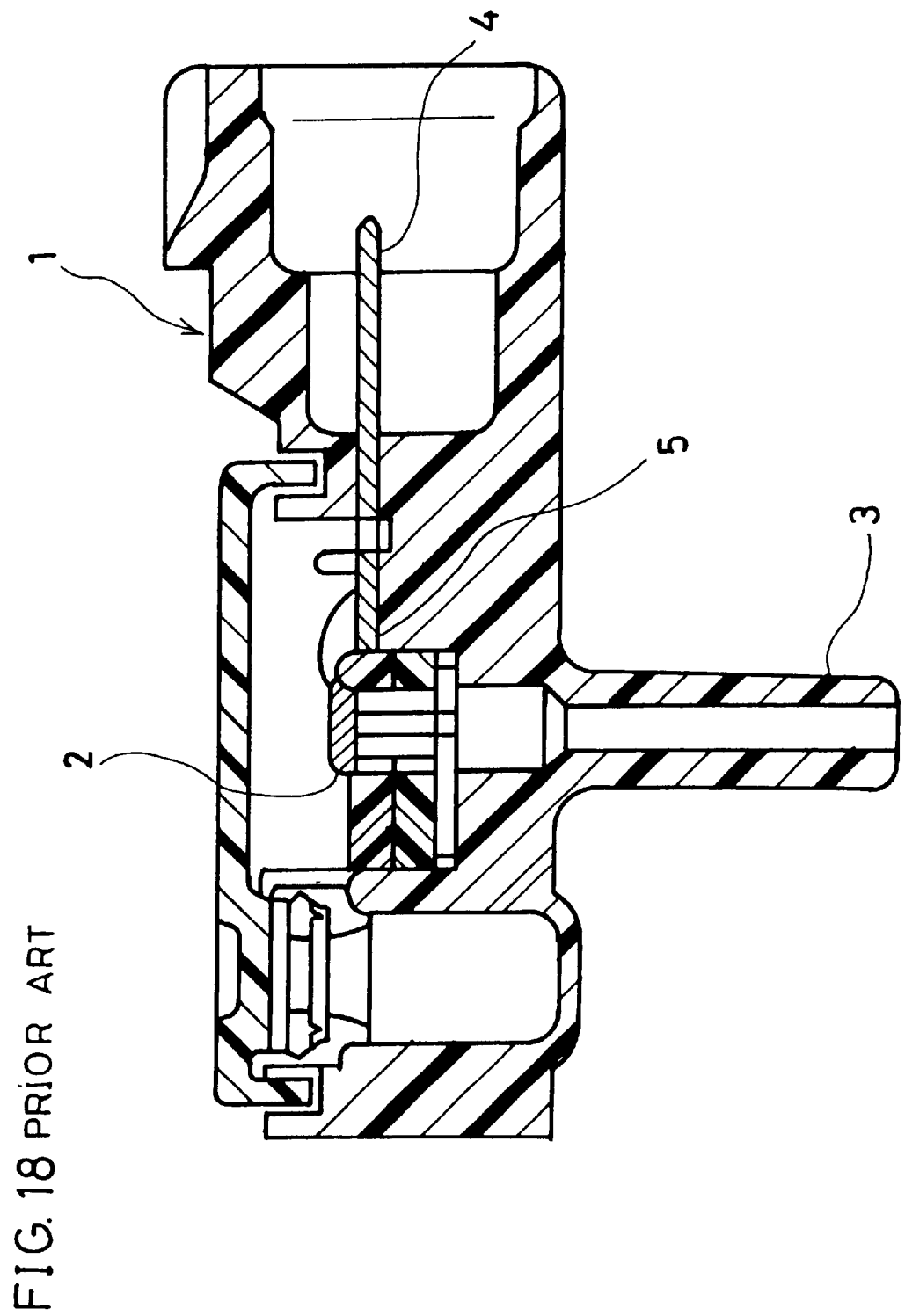
FIG. 18 is a sectional view of a pressure sensor device of the prior art.

FIG. 17 shows the structure that a water-repellant filter 29 is installed above the differential pressure through hole 27 of the base (at the outlet of the differential pressure through hole 27) in FIG. 16 of Embodiment 9. The filter which has been installed on the lower case is installed in the vicinity of the sensor element 13 to reduce the capacity of a differential pressure sensitive space 28 and improve pressure responsibility. In addition, the amount of air passing through the filter 29 decreases and the probability of choking caused by the adhesion of foreign matter is reduced by a drop in the adhesion of fine particles.

Embodiment 11

In this embodiment, an unshown water-repellant filter is installed in the vicinity of the base 14 on the pressure introduction passage 30 side of the differential pressure through hole 27 (at the inlet of the differential pressure through hole 27) in FIG. 16. The filter's effect of removing foreign matter is the same as in Embodiment 10. This water-repellant filter is installed on the lower case 6 side, thereby eliminating the step of installing a filter on the narrow sensor element and improving workability.

According to the first aspect of the present invention, a wall portion projecting to surround the sensor element is formed on the surface of the sensor module, a groove portion is formed in the upper case or the lower case, and an end of the wall portion is mated with this groove portion through an adhesive to form a closed space for storing the sensor element. The measurement of pressure and the confirmation of characteristic properties can be made with the sensor module. Even when the outer shape of the case or the shape of the connector is changed, the interior of the case does not have to be altered and a pressure sensor device having high reliability and excellent workability can be obtained.

According to the second aspect of the present invention, since a wall portion is formed on the surface of one side opposed to either one of the lower case and the upper case of the sensor module, the sensor module can be fixed in the case without fail.

According to the third aspect of the present invention, a wall portion is formed on both top and under surfaces opposed to both the lower case and the upper case of the sensor module and a groove portion is formed in both the upper case and the lower case, the sensor module can be fixed in the upper case and the lower case without fail.

According to the fourth aspect of the present invention, since a wall portion surrounding electronic parts such as a signal processing unit is formed on the surface of the sensor module and an end surface of the wall portion is contacted to the surface of the upper case or the lower case to form a closed space for storing electronic parts, the electronic parts can be set easily.

According to the fifth aspect of the present invention, since the length of the wall portion surrounding electronic parts is lengthened, and a groove portion is formed in the upper case or the lower case at a position corresponding to the wall portion and mated with the wall portion through an adhesive, the electronic parts can be set without fail.

According to the sixth aspect of the present invention, since a closed space for storing electronic parts and a closed space for storing the sensor element are located on opposite sides of the sensor module, the whole size of the sensor module can be reduced.

According to the seventh aspect of the present invention, since a closed space for storing electronic parts and a closed space for storing the sensor element are formed on opposite sides of the sensor module at positions corresponding to each other, the whole size of the sensor module can be further reduced.

According to the eighth aspect of the present invention, since the sensor module is made from a synthetic resin and lead frames for leading the signal of the sensor element to the outside are integrated with the sensor module in such as manner that they extend through the wall portion, air does not leak from the leading portions of the lead frames, thereby making it possible to improve reliability.

According to the ninth aspect of the present invention, when the sensor element and the wall portion surrounding this are provided on the upper case side of the sensor module and pressure hole for introducing a pressure medium is provided on the lower case of the sensor module, both types of sensor elements which receive pressure on the front side and the rear side can be set because a through hole which connects the pressure hole with the closed space for storing the sensor element is formed in the sensor module.

According to the tenth aspect of the present invention, since the sensor element is placed on the top surface of the sensor module through the pedestal and an introduction passage is formed in the pedestal at a position corresponding to the through hole, both types of sensor elements which receive pressure on the front side and the rear side can be set.

According to the eleventh aspect of the present invention, since the sensor element is placed on the top surface of the sensor module through the pedestal and the pedestal is shifted to a position which does not correspond to the through hole, both types of sensor elements which receive pressure on the front side and the rear side can be set.

According to the twelfth aspect of the present invention, since a differential pressure through hole is formed in the sensor module at a position which does not correspond to the pedestal and a differential pressure introduction hole for introducing a pressure medium from the outside is connected with the differential pressure through hole to receive a medium pressure from the differential pressure introduction hole and a medium pressure from the pressure hole on the top and under surfaces of the sensor element supported by the pedestal, two medium pressures can be detected.

According to the thirteenth aspect of the present invention, since a filter of purifying the medium is installed at the outlet or inlet of the differential pressure through hole, it is possible to prevent the sensor element from being fouled by impurities contained in the medium.

According to the fourteenth aspect of the present invention, since distal end portions of a plurality of lead frames are separated from other portions to form external connection portions, and the lead frames can be selectively connected to the external connection portions, the sensor element can be used whether it is normal or inverted.

According to the fifteenth aspect of the present invention, since a bent portion is formed at an intermediate portion of each of the lead frames, stress to be applied to the lead frame from outside can be reduced.

What is claimed is:

1. A pressure sensor device comprising:
    a sensor module having a pressure sensor element mounted on the front surface of the sensor module and a signal processing unit for amplifying an electric signal from the sensor element;
    an upper case and a lower case for holding the sensor module from above and below; and
    a pressure hole for introducing a pressure medium to the sensor element, wherein
    the sensor module has a wall portion, on a surface of the sensor module, which rises from the surface of the sensor module so as to surround the sensor element, a groove portion is formed in the upper case or lower case at a position corresponding to the wall portion, and an end of the wall portion is mated with the groove portion through an adhesive to form a closed space for storing the sensor element.

2. The pressure sensor device of claim 1, wherein the wall portion is formed on the surface of one side opposed to either one of the lower case and the upper case of the sensor module.

3. The pressure sensor device of claim 1, wherein the wall portion is formed on the top and under surfaces opposed to the lower case and the upper case of the sensor module.

4. The pressure sensor device of claim 1, wherein a wall portion for surrounding other electronic parts such as a signal processing unit is formed on the surface of the sensor module and an end surface of the wall portion is contacted to the surface of the upper case or the lower case to form a closed space for storing the electronic parts.

5. The pressure sensor device of claim 4, wherein the length of the wall portion surrounding the electronic parts is lengthened, a groove portion is formed in the upper case or the lower case at a position corresponding to this wall potion, and the wall portion is mated with the groove portion through an adhesive.

6. The pressure sensor device of claim 4, wherein a closed space for storing the electronic parts and a closed space for storing the sensor element are located on opposite sides of the sensor module.

7. The pressure sensor device of claim 4, wherein a closed space for storing the electronic parts and a closed space for storing the sensor element are located on opposite sides of the sensor module at positions corresponding to each other.

8. The pressure sensor device of claim 1, wherein the sensor module is made from a synthetic resin and lead frames for leading the signal of the sensor element to the outside are integrated with the sensor module in such a manner that they extend through the wall portion.

9. The pressure sensor device of claim 8, wherein a bent portion is formed at an intermediate portion of each of the lead frames.

10. The pressure sensor device of claim 1, wherein the sensor element and the wall portion surrounding this are provided on the upper case side of the sensor module, the pressure hole for introducing a pressure medium is formed in the lower case, and a through hole for connecting the pressure hole with a closed space for storing the sensor element is formed in the sensor module.

11. The pressure sensor device of claim 10, wherein the sensor element is placed on the top surface of the sensor module through a pedestal and an introduction passage is formed in the pedestal at a position corresponding to the through hole.

12. The pressure sensor device of claim 10, wherein the sensor element is placed on the top surface of the sensor module through a pedestal and the pedestal is shifted to a position not corresponding to the through hole.

13. The pressure sensor device of claim 10, wherein a differential pressure through hole is formed in the sensor module at a position not corresponding to the pedestal and connected with a differential pressure introduction hole for introducing a pressure medium from the outside so that a medium pressure from the differential pressure introduction hole and a medium pressure from the pressure hole are received by the top and under surfaces of the sensor element supported by the pedestal.

14. The pressure sensor device of claim 13, wherein a filter for purifying the medium is installed at the outlet or inlet of the differential pressure through hole.

15. The pressure sensor device of claim 8, wherein distal end portions of a plurality of lead frames are separated from other portions to form external connection portions and the lead frames can be selectively connected to the external connection portions.

* * * * *